(12) United States Patent
Lin et al.

(10) Patent No.: US 10,048,596 B2
(45) Date of Patent: Aug. 14, 2018

(54) METHOD AND APPARATUS FOR GENERATING ILLUMINATING RADIATION

(71) Applicant: ASML Netherlands B.V., Veldhoven (NL)

(72) Inventors: Nan Lin, Eindhoven (NL); Sander Bas Roobol, Veldhoven (NL); Simon Gijsbert Josephus Mathijssen, Rosmalen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/585,072

(22) Filed: May 2, 2017

(65) Prior Publication Data

US 2017/0322497 A1    Nov. 9, 2017

(30) Foreign Application Priority Data

May 4, 2016    (EP) .................................... 16168237

(51) Int. Cl.
*G03F 7/20* (2006.01)
*G02F 1/35* (2006.01)
(Continued)

(52) U.S. Cl.
CPC .......... *G03F 7/70575* (2013.01); *G02F 1/353* (2013.01); *G03F 7/2004* (2013.01);
(Continued)

(58) Field of Classification Search
CPC ............. G02F 1/353; G03F 2007/2067; G03F 7/2004; G03F 7/70033; G03F 7/70575;
(Continued)

(56) References Cited

U.S. PATENT DOCUMENTS

2005/0252752 A1* 11/2005 Fielden ............... G03F 7/70916
                                                           200/43.04
2006/0066855 A1    3/2006 Boef et al.
(Continued)

FOREIGN PATENT DOCUMENTS

CN          103972769       8/2014
WO      WO 2016/150957      9/2016
(Continued)

OTHER PUBLICATIONS

Ding et al., "High flux coherent super-continuum soft X-ray source driven by a single-stage, 10mi, Ti:sapphire amplifier-pumped OPA," Optical Society of America, Optics Express, vol. 22, No. 5, Mar. 2014; pp. 6194-6202.
(Continued)

*Primary Examiner* — Michelle M Iacoletti
(74) *Attorney, Agent, or Firm* — Sterne, Kessler, Goldstein & Fox P.L.L.C.

(57) ABSTRACT

An method for generating illuminating radiation in an illumination apparatus for use in an inspection apparatus for use in lithographic processes is described. A driving radiation beam is provided that comprises a plurality of radiation pulses. The beam is split into first and second pluralities of driving radiation pulses. Each plurality of driving radiation pulses has a controllable characteristic. The first and second pluralities may be used to generate an illuminating radiation beam with an output wavelength spectrum. The first and second controllable characteristics are controlled so as to control first and second portions respectively of the output wavelength spectrum of the illuminating radiation beam.

22 Claims, 8 Drawing Sheets

(51) Int. Cl.
*G21K 5/04* (2006.01)
*H05G 2/00* (2006.01)

(52) U.S. Cl.
CPC ...... *G03F 7/70033* (2013.01); *G03F 7/70625* (2013.01); *G03F 7/70633* (2013.01); *G21K 5/04* (2013.01); *H05G 2/00* (2013.01); *G03F 2007/2067* (2013.01)

(58) Field of Classification Search
CPC ... G03F 7/70625; G03F 7/70633; G21K 5/04; H05G 2/00
See application file for complete search history.

(56) References Cited

U.S. PATENT DOCUMENTS

| | | |
|---|---|---|
| 2008/0137696 A1 | 6/2008 | Zhang et al. |
| 2011/0102753 A1 | 5/2011 | Van De Kerkhof et al. |
| 2011/0140009 A1 | 6/2011 | Kaertner et al. |
| 2012/0044470 A1 | 2/2012 | Smilde et al. |
| 2014/0204963 A1 | 7/2014 | Chuang et al. |
| 2016/0149371 A1 | 5/2016 | Vampa et al. |

FOREIGN PATENT DOCUMENTS

| | | |
|---|---|---|
| WO | WO 2017/025392 | 2/2017 |
| WO | WO 2017/108410 A1 | 6/2017 |
| WO | WO 2017/186491 A1 | 11/2017 |

OTHER PUBLICATIONS

Feng et al., "Generation of Isolated Attosecond Pulses with 20 to 28 Femtosecond Lasers," The American Physical Society, Physical Review Letters, PRL 103, 183901, 2009; pp. 1-4.

Lewenstein et al., "Theory of high-harmonic generation by low-frequency laser fields," The American Physical Society, Physical Review Letters, vol. 49, No. 3, Mar. 1994; pp. 2117-2132.

Hamamatsu Photonics, Cameras Web Page, available at http://www.hamamatsu.com/eu/en/5005.html; 5 pages.

Chai et al., "Extreme ultra-violet movie camera for imaging microsecond time scale magnetic reconnection," Review of Scientific Instruments, vol. 84, No. 123504, 2013; pp. 1-5.

Sansone et al., "High-energy attosecond light sources," Nature Photonics, vol. 5, Nov. 2011; pp. 655-663.

Sansone et al., "Isolated Single-Cycle Attosecond Pulses," Science, vol. 314, Oct. 20, 2006; pp. 443-446.

Gilbertson, S., "Double Optical Gating," Department of Physics College of Arts and Sciences, Kansas State University, 2010; 219 pages.

Chang, Z., "Controlling attosecond pulse generation with a double optical gating," The American Physical Society, Physical Review A, vol. 76, No. 051403, 2007; pp. 1-4.

Mashiko et al., "Tunable frequency-controlled isolated attosecond pulses characterized by either 750 nm or 400 nm wavelength streak fields," Optical Society of America, Optics Express, vol. 18, No. 25, Dec. 6, 2010; pp. 25887-25895.

International Search Report and Written Opinion directed to International Patent Application No. PCT/EP2017/060322, dated Jul. 28, 2017; 16 pages.

Eichmann, H. et al., "Generation of short-pulse tunable xuv radiation by high-order frequency mixing," Physical Review, A. General Phys., The American Physical Society, Physical Review A, vol. 50, No. 4, Oct. 1994; pp. R2834-R2836.

Fujino et al., "EUV mask observations using a coherent EUV scatterometry microscope with a high-harmonic-generation source," Photomask and Next-Generation Lithography Mask Technology XXII, SPIE, vol. 9658, 2015; 8 pages.

Takahashi et al., "Nonlinear Attosecond Metrology by Intense Isolated Attosecond Pulses," IEEE Journal of Selected Topics in Quantum Electronics, IEEE Service Center, Piscataway, NJ, vol. 21, No. 5, Sep. 2015; 12 pages.

\* cited by examiner

METHOD AND APPARATUS FOR GENERATING ILLUMINATING RADIATION

FIELD

The present invention relates to a method and apparatus for generating illuminating radiation. In particular, the invention relates to a method and apparatus for generating illuminating radiation in a higher harmonic generating radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Multiple layers, each having a particular pattern and material composition, are applied to define functional devices and interconnections of the finished product.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatter meters tend to use light in the visible or near-IR wave range, which requires the pitch of the grating to be much coarser than the actual product structures whose properties are actually of interest. Such product features may be defined using deep ultraviolet (DUV) or extreme ultraviolet (EUV) radiation having far shorter wavelengths. Unfortunately, such wavelengths are not normally available or usable for metrology.

On the other hand, the dimensions of modern product structures are so small that they cannot be imaged by optical metrology techniques. Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

By decreasing the wavelength of the radiation used during metrology (i.e. moving towards the "soft X-ray" wavelength spectrum), the measurement performance improves since the radiation can penetrate further into the product structures. However, this requires a corresponding improvement in the spectral resolution of the metrology system. Additionally, the complexity of product structures is increasing, with product structures comprising increasing numbers of layers and a corresponding increase in thickness. This, in turn, increases the spectral resolution required to perform metrology measurements.

Further, radiation sources emitting DUV or EUV wavelengths may not be optimized to perform metrology measurements, which may negatively impact the accuracy and utility of such measurements. There is therefore a need for improved methods and radiation sources for generating radiation to be used in metrology measurements.

SUMMARY

According to a first aspect of the present invention, there is provided a method for generating an illuminating radiation beam in a higher harmonic generation radiation source, comprising:

providing a driving radiation beam, the radiation beam comprising a plurality of radiation pulses, for generating the illuminating radiation beam;

splitting the driving radiation beam into first plurality of driving radiation pulses and a second plurality of driving radiation pulses;

controlling a first controllable characteristic of the first plurality of radiation pulses to control a first portion of an output wavelength spectrum of the illuminating radiation beam; and controlling a second controllable characteristic of the second plurality of radiation pulses to control a second portion of the output wavelength spectrum of the illuminating radiation beam.

In some embodiments, controlling a first controllable characteristic may comprise controlling a delay of the first plurality of radiation pulses relative to the second plurality of radiation pulses by a specific delay value.

In some embodiments, at least one of the first controllable characteristic or the second controllable characteristic may be controlled so as to respectively cause the first portion or the second portion of the output wavelength spectrum to comprise a single wavelength continuum.

In some embodiments, at least one of controlling the first controllable characteristic or controlling the second controllable characteristic may comprise controlling a generation time window for higher harmonic generation of at least one pulse of the second plurality of driving radiation pulses.

In some embodiments, at least one of controlling the first controllable characteristic or controlling the second controllable characteristic may comprise performing gating on at least one of the first plurality of driving radiation pulses or the second plurality of driving radiation pulses.

In some embodiments, generalized double optical gating may be performed on at least one of the first plurality of driving radiation pulses or the second plurality of driving radiation pulses.

In some embodiments, at least one of controlling the first controllable characteristic or controlling the second controllable characteristic comprises performing pulse compression on at least one of the first plurality of driving radiation pulses or the second plurality of driving radiation pulses.

In some embodiments, at least one of the first controllable characteristic or the second controllable characteristic is controlled such that the second portion of the output wavelength spectrum is different from the first portion of the output wavelength spectrum.

According to a second aspect of the invention, there is provided a method for an inspection apparatus, comprising:

providing a first plurality of driving radiation pulses;

providing a second plurality of driving radiation pulses;

combining the first plurality of output pulses and the second plurality of output pulses into an illuminating radiation beam; and using the illuminating radiation beam to determine at least one characteristic of a target, wherein:

the step of providing a first plurality of radiation pulses comprises controlling a first controllable characteristic of the first plurality of radiation pulses to control a first portion of an output wavelength spectrum of the illuminating radiation; and the step of providing a second plurality of radiation pulses comprises controlling a second controllable characteristic of the second plurality of radiation pulses to control a second portion of the output wavelength spectrum of the illuminating radiation.

The invention further provides an illumination apparatus comprising means for carrying out the method as set forth above.

the invention yet further provides an inspection apparatus comprising for carrying out the method as set forth above.

the invention yet further provides a lithographic apparatus comprising an inspection apparatus as set forth above.

The invention yet further provides a method of manufacturing devices wherein device features and metrology targets are formed on a series of substrates by a lithographic process, wherein properties of the metrology targets on one or more processed substrates are measured by a method as set forth above, and wherein the measured properties are used to adjust parameters of the lithographic process for the processing of further substrates.

The invention yet further provides a computer program product containing one or more sequences of machine-readable instructions for implementing controlling steps in a method according to the invention as set forth above.

The invention yet further provides a lithographic system comprising:

a lithographic apparatus comprising:

an illumination optical system arranged to illuminate a pattern, a projection optical system arranged to project an image of the pattern onto a substrate; and an inspection apparatus as set forth above, wherein the lithographic apparatus is arranged to use one or more parameters calculated by the inspection apparatus in applying the pattern to further substrates.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
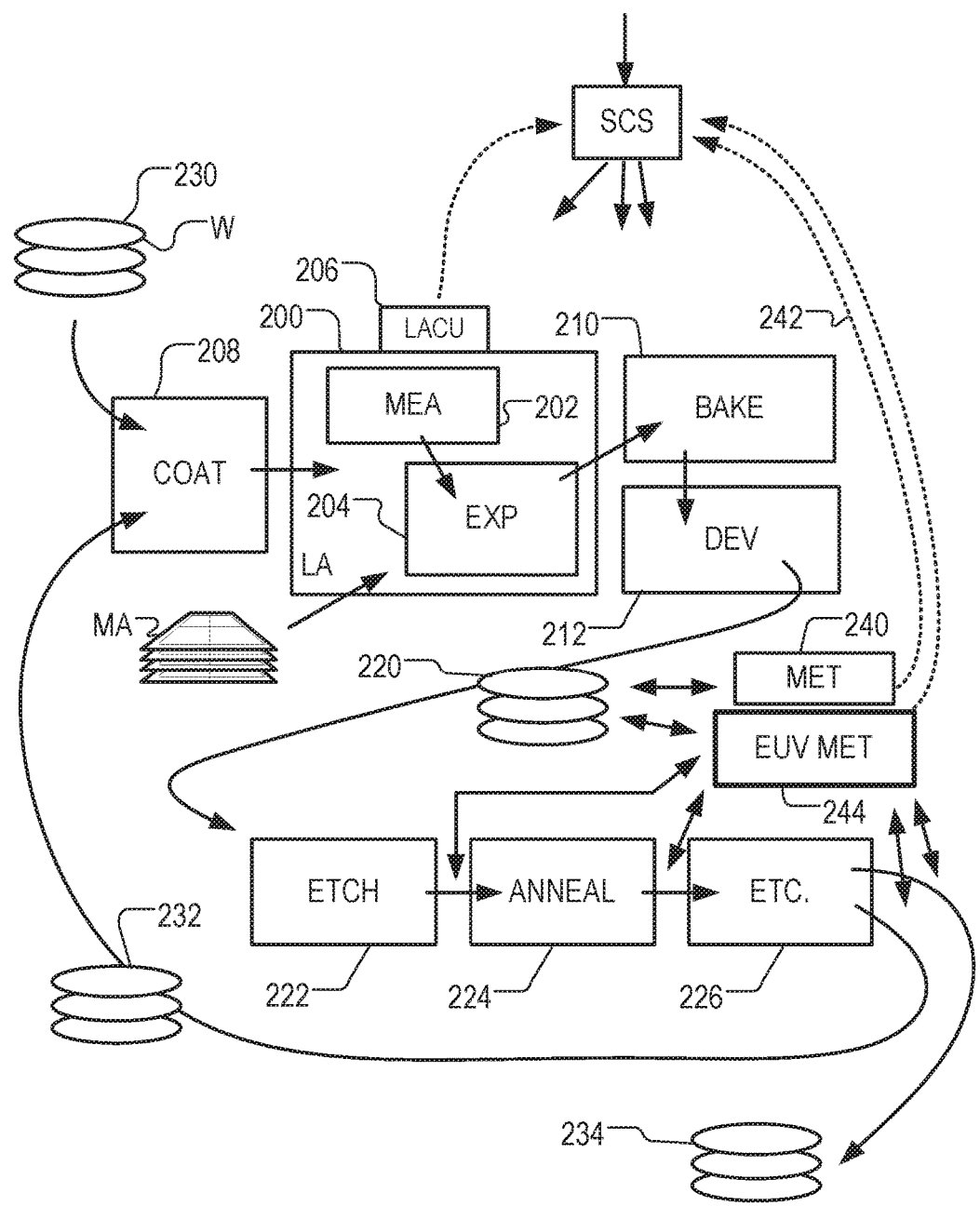
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables WTa and WTb and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 2:
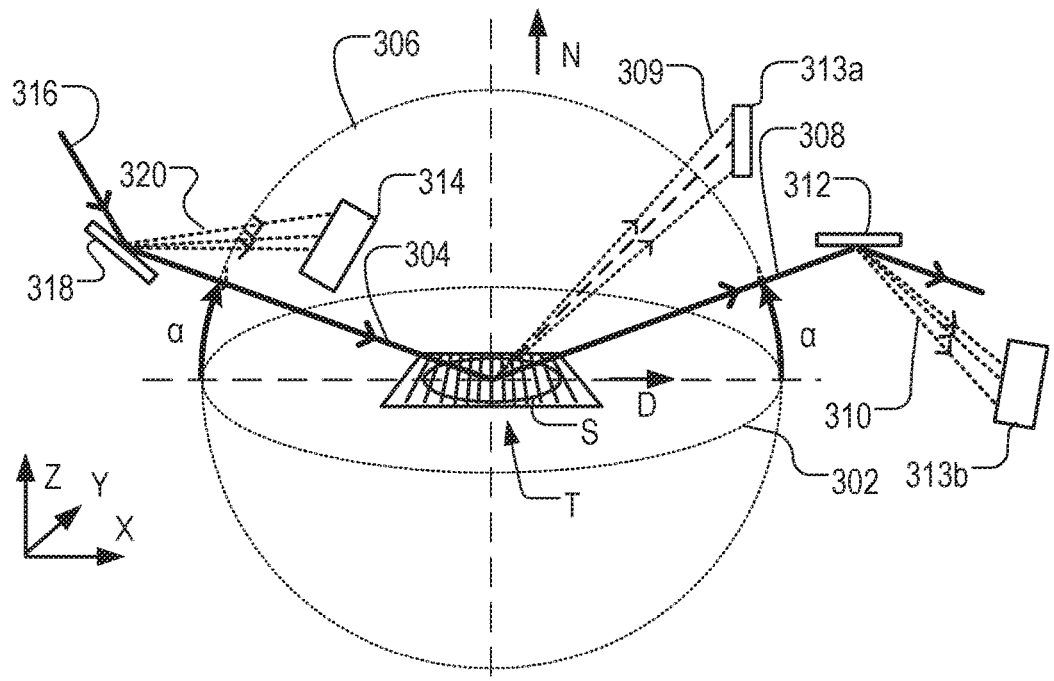
FIG. 2 depicts the geometry of incident and reflected rays in relation to a grating target in a metrology method usable in an embodiment of the present invention.
Figure 3:
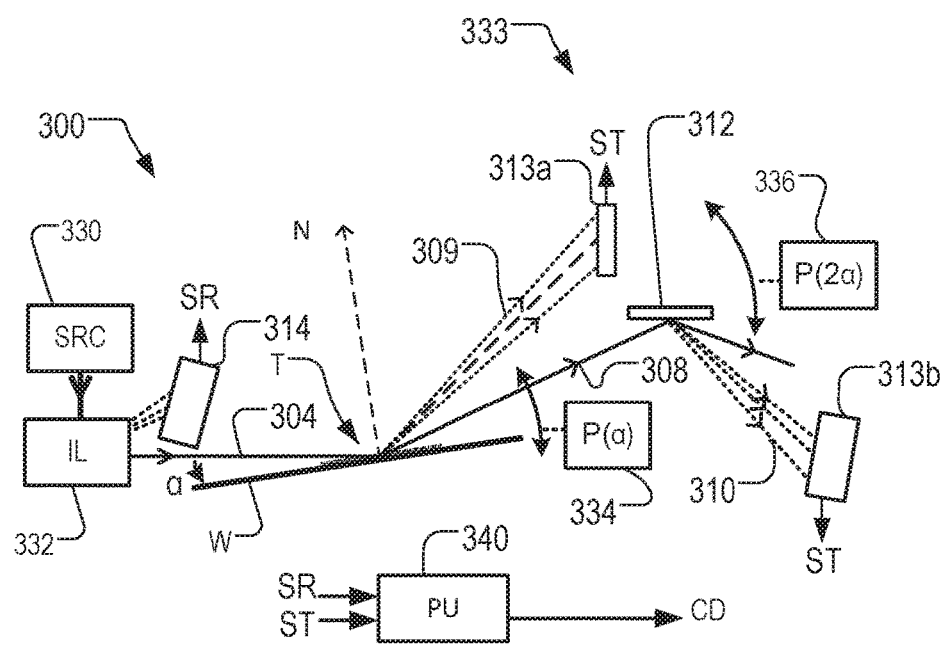
FIG. 3 illustrates schematically the components of a metrology apparatus, performing the method of FIG. 2.

FIG. 2 illustrates an EUV metrology method while FIG. 3 illustrates an EUV metrology apparatus 300. The apparatus can be used as an example of EUV metrology apparatus 244 for measuring parameters of substrates W processed in the manufacturing system of FIG. 1.

In FIG. 2, the target T is represented schematically as comprising a one-dimensional grating structure at the origin of a spherical reference frame. Axes X, Y and Z are defined relative to the target. (Of course any arbitrary coordinate system can be defined in principle, and each component may have its own local reference frame, that can be defined relative to the one shown.) The direction of periodicity D of the target structure is aligned with the X axis. The drawing is not a true perspective drawing, but a schematic illustration only. The X-Y plane is the plane of the target and substrate, and for clarity is shown tilted toward the viewer, represented by an oblique view of circle 302. The Z direction defines the direction N normal to the substrate. In FIG. 2, one of the incident rays is labeled 304 and has an angle α of grazing incidence. In this example, the incident ray 304 (and all incident rays forming the radiation spot S) lie substantially in a plane parallel to the X-Z plane, that is a plane defined the directions D and N and represented by circle 306. A reflected ray 308 that is not scattered by the periodic structure of the target T emerges towards the right hand side of the target in the diagram, with an elevation angle α. Some of the radiation of incident ray 304 is scattered by the target T into a number of diffraction orders in a known manner. A scattered ray 309 that comprises $1^{st}$ order scattered radiation is shown. In the shown example, the $1^{st}$ order scattered radiation comprises a number of individual rays of different wavelengths. The scattered radiation may be detected by a detector 313a, which may for example be a CCD image detector having an array of pixels.

To perform spectroscopic reflectometry, ray 308 and other reflected rays are broken into a spectrum 310, comprising rays of different wavelengths. The spectrum may be produced for example using a grazing incidence diffraction grating 312. The spectrum is detected by a second detector 313b. Similarly to the first detector, this detector may for example be a CCD image detector having an array of pixels. The first and second detectors are both used to transform the detected spectrums into electrical signals and eventually digital data for analysis.

In a practical system, the spectrum of radiation 304 may be subject to time variations, which would disturb the analysis. In order to normalize the detected spectrum against these variations, a reference spectrum is captured by a second detector 314. To produce the reference spectrum, source radiation 316 is diffracted by another diffraction grating 318. A zero order reflected ray of grating 318 forms the incident ray 304, while the first order diffracted rays 320 of grating 318 form the reference spectrum detected by reference spectrum detector 314. Electrical signals and data representing the reference spectrum are obtained for use in the analysis.

From the measured spectrum, obtained for one or more values of incidence angle α, a measurement of a property of the target structure T can be calculated in a manner described further below.

Turning to FIG. 3, EUV metrology apparatus 300 is provided for measuring properties of a metrology target T formed on substrate W, by the method of FIG. 2. Various hardware components are represented schematically. The practical implementation of these components can be performed by the relevant skilled persons applying a mixture of existing components and specially-designed components, according to well-known design principles. A support (not shown in detail) is provided for holding the substrate at a desired position and orientation relative to other components to be described. A radiation source 330 provides radiation to an illumination system 332. Illumination system 332 provides a beam of EUV radiation represented by ray 304 which forms a focused irradiation spot on target T. Illumination system 332 also provides the reference spectrum 320 to detector 314. Components 312, 313a, 313b etc. may be conveniently considered as a detection system 333.

Substrate W in this example is mounted on a movable support having a positioning system 334 such that an angle of incidence α of ray 304 can be adjusted. In this example, it is chosen as a matter of convenience to tilt the substrate W to change the incidence angle, while the source 330 and illumination system 332 remain stationary. In order to catch the reflected ray 308, detection system 333 is provided with a further movable support 336, so that it moves through an angle 2α relative to the stationary illumination system, or through an angle a relative to the substrate. In the grazing incidence regime of reflectometry, it is convenient to define the incidence angle α by reference to the plane of the substrate, as shown. Of course, it could equally be defined as an angle between the direction of incidence of incident ray I and a direction N normal to the substrate.

Additional actuators, not shown, are provided for bringing each target T into a position where the focused spot S of radiation is located. (Looking at it another way, to bring the spot to the position where the target is located.) In a practical application, there may be a succession of individual targets or target locations to be measured on a single substrate, and a succession of substrates too. It is immaterial, in principle, whether the substrate and target are moved and reoriented while the illumination system and detector stay still, or whether the substrate stays still while the illumination system and detector are moved, or whether different components of the relative movement are achieved by a combination of these techniques. The present disclosure encompasses all these variants.

As already described with reference to FIG. 2, as target T is periodic, a portion of the incident radiation is scattered into distinct orders. A 1$^{st}$ order of scattered radiation 309, which in the present example comprises a plurality of rays having different wavelengths, is shown in FIG. 3. The scattered radiation impinges on first detector 313a. A portion of the radiation is reflected by target T and substrate W, and is subsequently split into a spectrum 310 of rays of different wavelengths, before it impinges on detector 313b. Detectors 313a and 313b comprise for example position-sensitive EUV detectors, e.g. arrays of detector elements. The arrays may be linear arrays, but in practice 2-dimensional arrays of elements (pixels) may be provided. Detectors 313a and 313b may be for example CCD (charge coupled device) image sensors.

A processor 340 receives signals from the detectors 313 and 314. In particular, signal ST from detectors 313a and/or 313b represents the target spectrum and signal SR from detector 314 represents the reference spectrum. Processor 340 can subtract the reference spectrum from the target spectrum to contain a reflection spectrum of the target, normalized against variation in the source spectrum. The resulting reflection spectra for one or more angles of incidence are used in the processor to calculate a measurement of property of the target, for example CD or overlay.

In practice, radiation from source 330 may be provided in a series of short pulses and signals SR and ST may be captured together for each pulse. Difference signals for each individual pulse are calculated, before being aggregated into an overall reflection spectrum for this target at this angle of incidence. In this way, instability of the source spectrum between pulses is corrected for. The pulse rate may have any suitable value, from hundreds of thousands of repetitions per second (Hz), and up to (and including) millions of repetitions per second (MHz).The number of pulses aggregated to measure one reflection spectrum may be tens or hundreds, for example. Even with so many pulses, the physical measurement takes a fraction of one second.

In the application of this EUV-SR to metrology in semiconductor manufacturing, small grating targets can be used. Multiple diffraction spectra are captured using detectors 313a, 313b and 314, while setting the grazing angle of incidence α to various different values. Using the detected spectra and a mathematical model of the target structure, reconstruction calculations can be performed to arrive at measurement of CD and/or other parameters of interest. An example reconstruction method will be illustrated further below.

Considering briefly the target itself, dimensions of the lines and spaces will depend on the target design, but the period of the structure may be for example less than 100 nm, less than 50 nm, less than 20 nm, even less than 10 nm and down to 5 nm. The lines of the grating structure may be of the same dimension and pitch as product features in a product area of the substrate. The lines of the grating structure may in fact be the lines of a product structure, rather than a target structure formed, within a dedicated target area, solely for the purposes of metrology. Such small features may be formed for example in an EUV lithography process, by imprint lithography or by direct-write methods. Such small features may also be formed using present-day DUV lithography, by a so-called double-patterning processes (generally multiple-patterning). Techniques in this category include pitch-doubling, for example by litho-etch-litho-etch (LELE) and self-aligned dual-damascene in back end-of the line (BEOL) layers. For the purposes of explanation, it will be assumed in the following examples that CD is the parameter of interest. However, where there are two gratings formed on top of one another, another parameter of interest maybe overlay. This can be measured based on asymmetry in the EUV-SR diffraction orders, as described separately below. The incidence angle can be elevated if necessary to achieve adequate penetration to the lower structure.

In the multiple-patterning process, structures are formed in one layer of the product not in one patterning operation but in two or more patterning steps. Thus, for example, a first population of structures may be interleaved with a second population of structures, and the populations are formed in different steps, so as to achieve a higher resolution than one step alone can produce. While the placement of the populations should be identical and perfect in relation to other features on the substrate, of course every real pattern exhibits a certain positional offset. Any unintentional positional offset between the populations can be regarded as a form of overlay, and can be measured by analogous techniques to those used to measure overlay between layers. Additionally, overlay against features in an underlying or overlying layer can be different for each population when multiple populations of features are formed in a single layer, and overlay for each of these populations can be measured separately if desired.

Figure 4A:
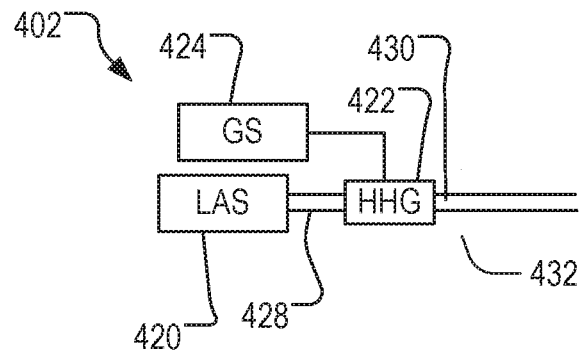
FIGS. 4(a) and 4(b) illustrate a radiation source usable in the apparatus of FIG. 3.

FIG. 4(a) shows a source 402 comprising for example a generator of EUV radiation based on high harmonic generation (HHG) techniques. Main components of the radiation source are a pump laser 420 and an HHG gas cell 422. A gas supply 424 supplies suitable gas to the gas cell. The pump laser may be for example a Titanium-Sapphire based laser, which produces pulses, having a wavelength of 800 nm and a sub-picosecond pulse width, at a repetition rate of several kHz. In another example, the pump laser may be a fiber-based laser with an optical amplifier, with a pulse repetition rate up to several megahertz, as required. Typical pulse durations may be in the sub-picosecond range. The wavelength may be for example in the region of 1 µm. The driving radiation pulses are delivered as a first beam of radiation 428 to the HHG gas cell 422, where a portion of the radiation is converted to higher frequencies. The illuminating radiation beam 430 (which corresponds to the incident ray 304 of FIG. 3) includes both coherent radiation of the desired EUV wavelength or wavelengths and driving radiation pulses of the first beam. One or more filtering devices 432 may be provided. A filter, such as a thin membrane of Aluminum (Al), may serve to cut the fundamental IR radiation from passing further into the inspection apparatus. It should be noted that the filtering properties of such a filter depends on the material of the membrane. As such, it is possible to control the filtering properties of the filter by selection of the membrane material. It will be appreciated that a number of specific choices of membrane material may be envisaged. Some or all of the radiation path may be contained within a vacuum environment, bearing in mind that the desired EUV radiation is absorbed when traveling in air. The various components of radiation source 402 and illumination optics 404 can be adjustable to implement different metrology 'recipes' within the same apparatus. For example different wavelengths and/or polarization can be made selectable.

Figure 4B:
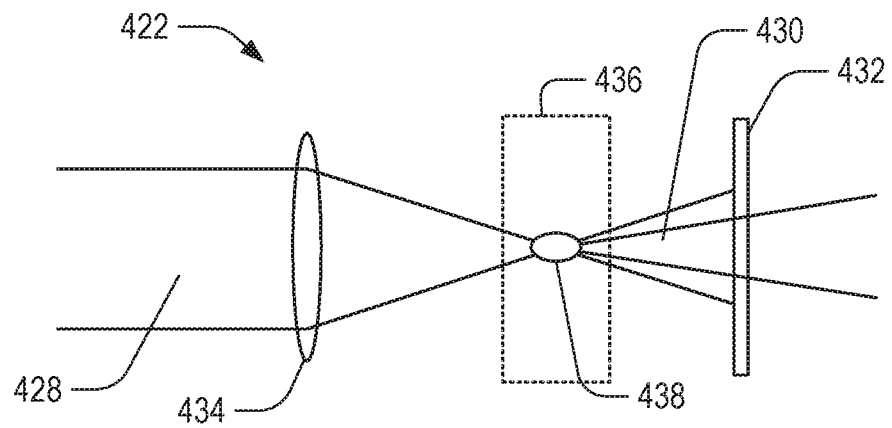

FIG. 4(b) shows a more detailed view of the HHG gas cell 422. The first beam of radiation 428 enters the gas cell. The beam is focused by a focus element 434. It will of course be appreciated that the focus element may comprise one or several optical components. The focus element has a specific focal length, and is operable to focus the first beam of radiation substantially into a focal point 438. The focal point is located inside the gas volume 436 of the HHG gas cell. At the focal point, the radiation pulses interact with the gas, thereby converting a portion of the radiation to higher frequencies. As mentioned above, the illuminating radiation beam 430 includes both coherent radiation of the desired EUV wavelength or wavelengths and driving radiation pulses of the first beam. In order to prevent the driving radiation from propagating further, which may influence the measurements or even cause damage to the target or detector, the filter 432 filters out the unwanted portions of the illuminating radiation beam as described above.

Certain metrology measurements, such as measurements of Critical Dimension (CD) of patterned structures, benefit from radiation having a large radiation bandwidth. Using radiation with a larger bandwidth provides more information than radiation with a narrower bandwidth, which improves the reconstruction accuracy. In turn, improved reconstruction accuracy increases the accuracy of the metrology apparatus and by extension the performance of the lithographic apparatus. It will of course be realized that, while the following examples will be described with reference to measuring Critical Dimension, the principles of the following examples may be applied to other types of metrology measurements (e.g. overlay error) or other types of imaging methods (e.g. coherent diffraction imaging).

A HHG radiation source typically outputs a number of radiation peaks, each peak representing a harmonic order. A wavelength interval between adjacent harmonic orders can be defined as:

$$\Delta\lambda = \frac{\lambda_D}{N} - \frac{\lambda_D}{N+2} \approx \frac{2\lambda_D}{N^2}$$

$\lambda_D$ denotes the wavelength of the drive radiation, and N is the number of the harmonic order. As can be seen, for higher harmonic orders, the wavelength interval decreases. Accordingly, for harmonic orders with a sufficiently high order, the width of the harmonic peaks will be equal to or larger than the wavelength interval between the peaks. Hence, for sufficiently high harmonic orders, the corresponding radiation peaks will at least partially overlap to form a quasi-continuum. For lower order harmonics, the wavelength interval between the radiation peaks increases proportionally with decreasing harmonic order number. Hence, the radiation peaks corresponding to lower harmonic orders do not overlap because the wavelength interval between adjacent harmonic orders is larger than the spectral width of the radiation peaks.

Figure 5:
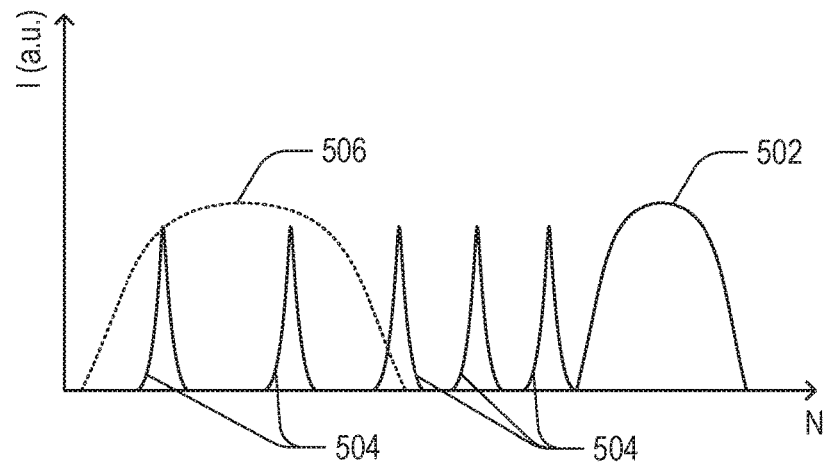
FIG. 5 is a schematic illustration of an output spectrum of a radiation source of FIG. 4.

This is illustrated in FIG. 5, illustrates schematically an exemplary output spectrum from a radiation source such as the one illustrated in FIG. 4.

The exemplary radiation source outputs a first continuum 502 of radiation. The first continuum is comprised of individual radiation peaks whose width is larger than that of the wavelength interval between the peaks. It will of course be realized that the shape of the spectrum is for illustrative purposes only, and that, in reality, a continuum may comprise distinct radiation peaks. In one example, the wavelength range of the continuum is approximately 12-16 nm. In other examples, the wavelength range of the continuum may be 6-11 nm, 10-18 nm, 11-25 nm, 20-28 nm, 20-40 nm or 25-40 nm. Additionally, the exemplary HHG radiation source outputs a number of radiation peaks 504 at a number of specific wavelengths. The radiation peaks represent the lower order harmonics output by the radiation source, where the wavelength interval between individual peaks is larger than the peak widths. It should be noted that, in the case of a regular HHG radiation source, only odd-numbered harmonics are present. It is, however, equally possible to envisage, as well as implement, HHG radiation sources wherein only even-numbered harmonics are generated.

As described above, it may be advantageous when carrying out metrology measurements (such as CD measurements) to increase the overall spectral width of the output radiation of the radiation source. For example, it would be advantageous if the radiation source could be modified so as to output a second radiation continuum 506 in addition to the first continuum 502.

The inventors have realized that it is possible to enable a HHG radiation source to provide a continuum at higher wavelength ranges, by increasing the spectral width of the radiation peaks corresponding to lower harmonic orders. As the spectral width of a radiation peak generated in a HHG source is defined by the envelope of the driving radiation pulse used to generate it, performing pulse compression or gating methods on the driving radiation pulses, or portions thereof, will widen the spectral width of the radiation peaks. If widened sufficiently, a number of radiation peaks may form a continuum. This will now be explained further with reference to FIGS. 6(a) and 6(b), which shows a simple schematic illustration of pulse compression in a HHG radiation source.

Figure 6A:
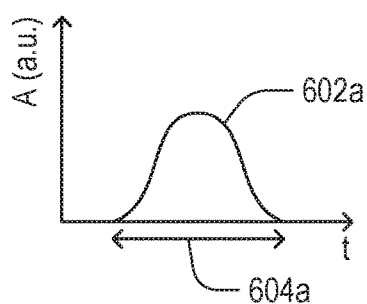
FIGS. 6(a) and 6(b) are a schematic illustration of a pulse compression method.
Figure 6A:
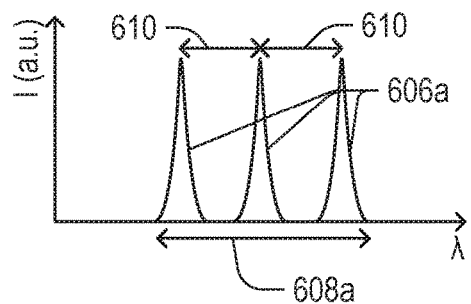

FIG. 6(a) shows a radiation pulse 602a with a specific pulse duration 604a, such as emitted by laser source 420 of FIG. 4. As described above, when the radiation from the laser source interacts with the gas in the HHG gas cell, a number of radiation peaks 606a are generated. The radiation peaks are spread out over a wavelength range 608a, and each radiation peak is separated from adjacent radiation peaks by a wavelength interval 610 (as described above). As can be seen, in the present example, the width of the radiation peaks is smaller than the wavelength interval between them. It will of course be realized that three radiation peaks are shown for exemplary purposes only, and that more radiation peaks may be emitted.

Figure 6B:
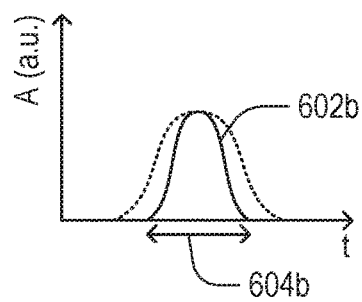
Figure 6B:
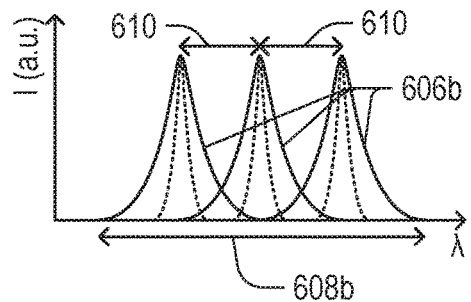

In FIG. 6(b) pulse compression is performed on the pulse 602b so as to shorten the pulse duration 604b. The original pulse 602a of FIG. 6(a) is indicated by the dashed line. When the shortened pulse interacts with the gas in the HHG gas cell, a number of radiation peaks 606b are generated. Compared with the radiation peaks 606a of the non-compressed pulse 602a, each of the radiation peaks 606b are broadened spectrally. This, in turn, broadens the wavelength range 608b occupied by the radiation peaks. The original radiation peaks 606a of FIG. 6(a) are indicated by the dashed lines. As can be seen, after pulse compression, the radiation peaks have been broadened such that the peaks overlap spectrally. In other words, intensity between the peaks is now non-zero, thereby creating a radiation continuum.

A number of mechanisms for performing pulse compression may be envisaged and implemented in the radiation source such as the one shown in FIG. 4. One known mechanism is known as "General Double Optical Gating" (GDOG) and is described in "Generation of Isolated Attosecond Pulses with 20 to 38 Femtosecond Lasers", Feng et al., *Physical Review Letters* 103, 2009. Another mechanism is known as "ionization gating" and is described in "High energy attosecond light sources", Giuseppe Sansone et al., *Nature Photonics* 5, 655-663 (2001). Yet another known mechanism is known as "post pulse compression", as described in "Isolated single-cycle attosecond pulses", Giuseppe Sansone et al., *Science, vol* 314, 443-446, 2006. An exemplary apparatus 700 and method for generating illuminating radiation in a higher harmonic generation radiation source will now be discussed with reference to FIGS. 7 and 8.

In a first step 801, a driving radiation beam 702 for generating illuminating radiation is provided. The driving radiation beam comprises a plurality of radiation pulses 704. The radiation pulses may be generated by a suitable radiation source with a suitable pulse repetition rate and output radiation wavelength spectrum. In one example, the radiation source is the laser source 420 described with respect to FIG. 4 above. It will however be appreciated that other radiation sources with other radiation wavelengths may be envisaged.

In a second step 802 the driving radiation beam 702 is split into first plurality of driving radiation pulses 706a and a second plurality of driving radiation pulses 708a by a first beamsplitting element 710. In one example, the beamsplitting element is a beamsplitter (e.g. a partially transmitting mirror surface). The beamsplitting element may be configured to split incoming radiation in any suitable way. In one example, the beamsplitting element is operable to split the driving radiation beam such that the intensity of the pulses in the first plurality of driving radiation pulses is substantially 70% of the intensity of the driving radiation beam pulses and the intensity of the pulses in the second plurality is 30% of the intensity of the driving radiation beam. In other examples, different split ratios may be used, such as (but not limited to): 90%/10%, 80%/20%, or 60%/40%. The specific split ratio chosen for a particular target is dependent on a number of factors including, but not limited to: a desired output wavelength spectrum of the generated illuminating radiation; conversion efficiency in the HHG gas cell of the driving radiation pulses; and wavelength-dependent measurement sensitivity for a characteristic (e.g. CD) of the target under measurement. In some examples, the split ratio is fixed, e.g. based on the properties of the beamsplitter material. In other examples, the split ratio may be varied in order to optimize the illuminating radiaton, e.g. based on the properties of the target to be measured. It will of course be noted that the driving radiation beam is split into two pluralities of driving radiation pulses for exemplary purposes only. In other examples, the driving radiation beam may be split into three or more pluralities of driving radiation pulses.

In a third step 803, a first controllable characteristic of the first plurality of radiation pulses 706a is controlled so as to control a first portion of an output wavelength spectrum of the illuminating radiation. In one example, the controllable characteristic is a delay of the first plurality of radiation pulses relative to the second plurality of driving radiation pulses. The first plurality of driving radiation pulses propagate through a delay element 712, which outputs first plurality of delayed driving radiation pulses 706b. The delay may be set to any suitable value. In some examples, the delay may have a fixed value. In other examples, the delay value may be varied in a suitable fashion. In a specific example, the value of the delay is set so that there is no temporal overlap between the any of the pulses of the first plurality and any of the pulses of the second plurality. In some examples, the delay is between 1 ns and 10 ns. In other examples, the delay is greater than 3 ns, 4 ns or 5 ns.

The HHG process may be distorted or negatively influenced if there is overlap between corresponding radiation pulses in the first and second pluralities. Accordingly, the delay may be chosen to avoid any temporal overlap between driving radiation pulses of the first plurality and the second plurality. Additionally, each HHG emission generates a short-lived plasma. The delay time may be chosen so as to avoid any interaction between HHG plasma generated by successive pulses. Typically, plasma decay times are be measured in picoseconds. Accordingly, the delay may in a specific example be chosen so as to be larger than 1 ns. In other examples, the delay time is chosen so as to be larger for a minimum response time of the detector (or detectors). This enables successive pulses to be detected separately by the detector.

The delay may be introduced in any suitable fashion. In some examples, the delay may be introduced by modifying the optical path length of the radiation pulses. In such examples, the delay element may comprise one or several movable optical elements, e.g. mirrors.

It should be noted that, in addition to or alternatively to the delay element, the apparatus may optionally comprise one or more additional components 715 that may be used to modify the first plurality of driving radiation pulses in a suitable manner. For example, the additional component may be operable to modify the pulses of the first plurality of driving radiation pulses so as to change the wavelength spectrum generated by the interaction of the first plurality of pulses with the gas in the HHG gas cell. In an example, the additional component may be an optical parametric amplifier. In another example, the additional component may be a pulse control element similar to pulse control element 714 described below. As such, while described in connection with the second controllable characteristic, the pulse control element could, in principle, equally well be used to control the first controllable characteristic.

In a fourth step 804, a second controllable characteristic of the second plurality of radiation pulses 708a is controlled so as to control a second portion of the output wavelength spectrum of the illuminating radiation. In one example, the controllable characteristic is controlled so as to cause the second portion of the output wavelength spectrum to comprise a single wavelength continuum. In some examples, controlling the second controllable characteristic comprises controlling a generation time window for higher harmonic generation of at least one pulse of the second plurality of radiation pulses. The wavelength spectrum is controlled by the pulse control element 714, which outputs a second plurality of controlled radiation pulses 708b.

The pulse control element may be implemented in any suitable manner, using any suitable mechanism. In an example, the second plurality of driving radiation pulses is gated in a suitable fashion. In an example, the pulse control element performs General Double Optical Gating on the second plurality of radiation pulses. In another example, pulse compression is performed on at least one pulse of the second plurality of driving radiation pulses. In one example, the second controllable characteristic is controlled such that the second portion of the output wavelength spectrum of the illuminating radiation is different from the first portion of the output wavelength spectrum of the illuminating radiation.

In an optional fifth step 805, the first plurality of driving radiation pulses and the second plurality of driving radiation pulses are recombined into an output radiation beam 718 by a second beamsplitting element 716. In one example, the second beamsplitting element is a beamsplitter. The second radiation beam may then be used to generate the illuminating radiation.

It will of course be appreciated that, while the above apparatus has been shown implemented with "macro" optic elements, the above apparatus can be implemented in any suitable fashion. For example, the apparatus could be implemented using optical fiber components. In another example, the above apparatus is implemented using integrated optical components.

Figure 7:
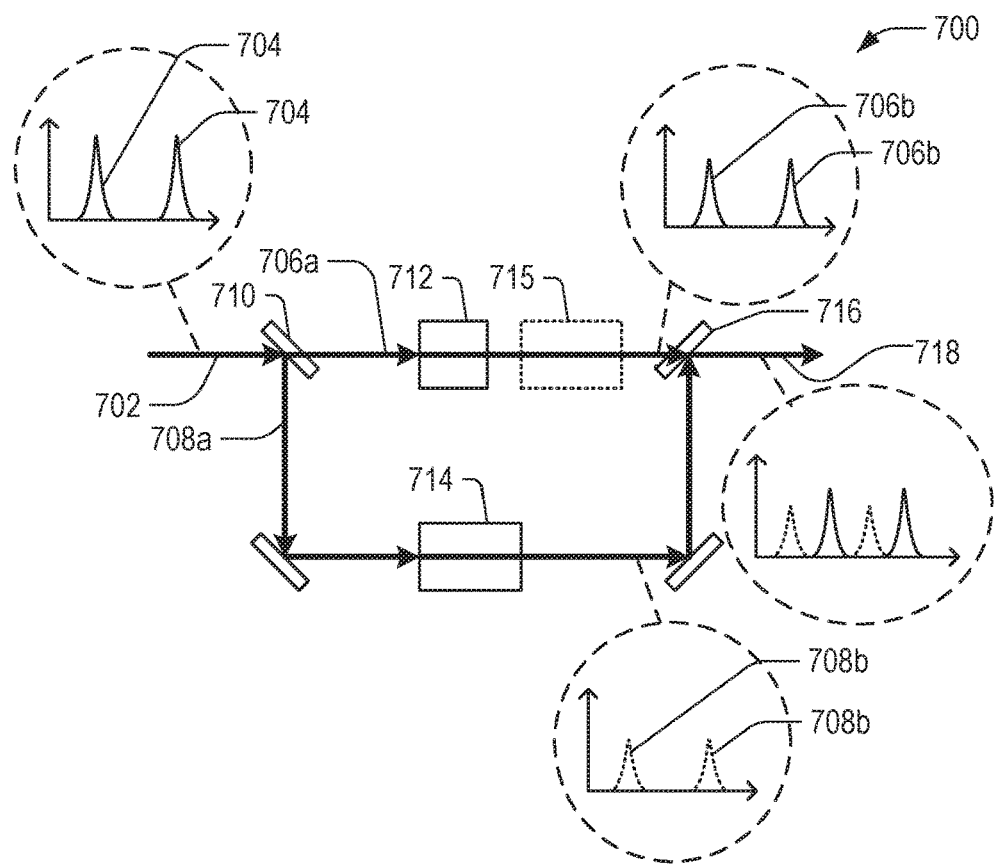
FIG. 7 is a schematic diagram of an illumination system in accordance with a first embodiment of the present invention.
Figure 8:
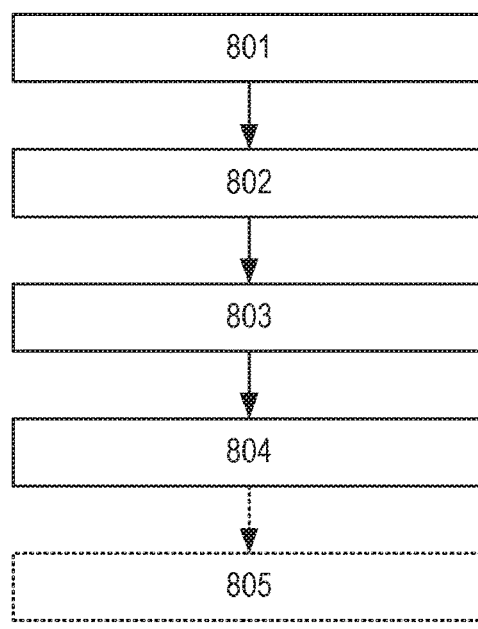
FIG. 8 is an illustration of a method for using the illumination system of FIG. 7.
Figure 9:
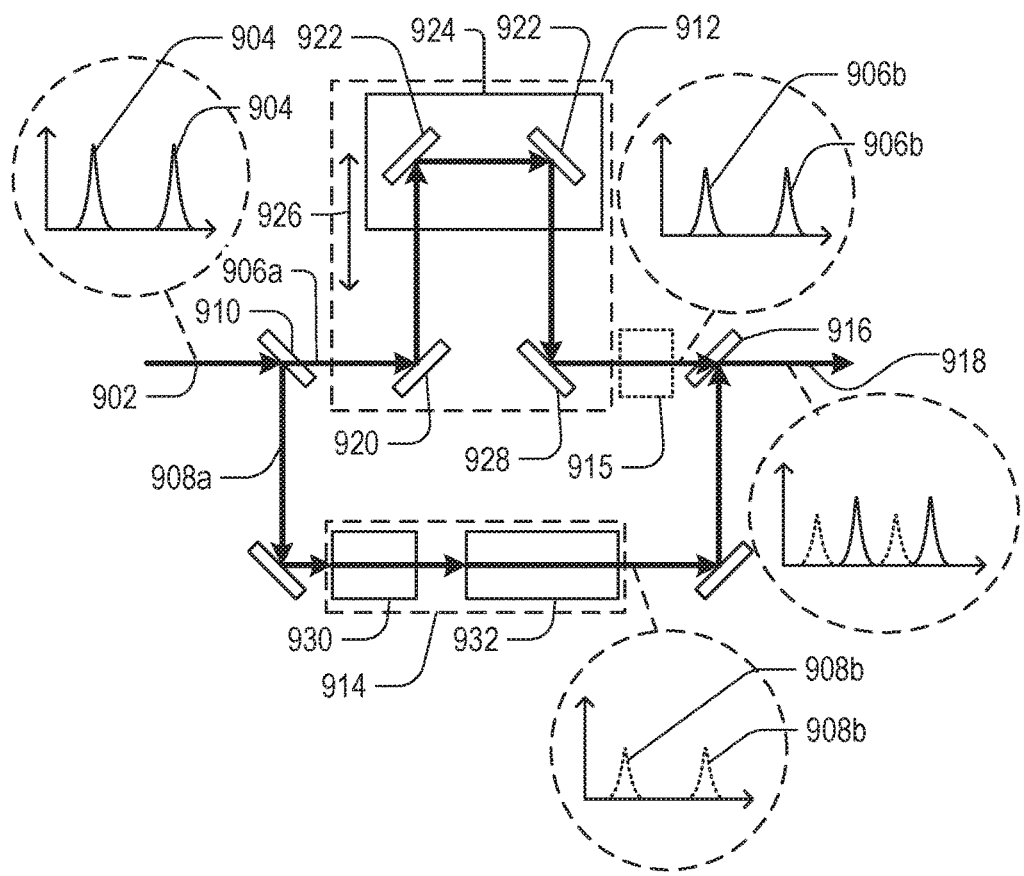
FIG. 9 is a schematic diagram of an illumination system in accordance with a second embodiment of the present invention.
Figure 10:
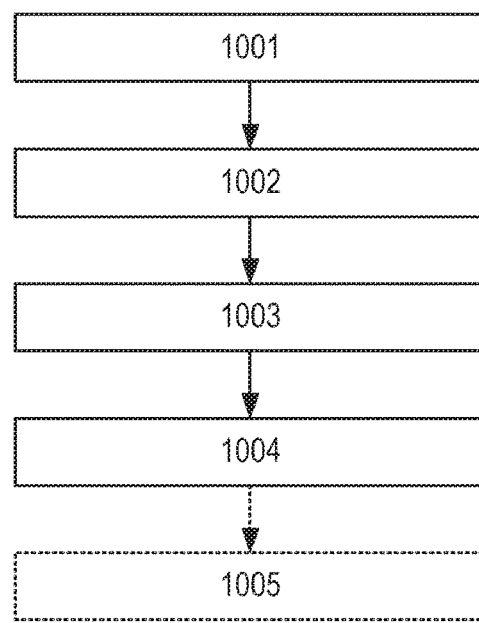
FIG. 10 is an illustration of a method for using the illumination system of FIG. 9.

FIGS. 9 and 10 illustrate a second exemplary method and apparatus for generating radiation. For ease of comparison with FIGS. 7 and 8, elements of FIGS. 9 and 10 similar to corresponding elements of FIGS. 7 and 8 are labelled with reference signs similar to those used in FIGS. 7 and 8, but with prefixes "9" and "10" instead of "7" and "8" respectively. Further, only the features of the method and apparatus that differ from those of FIGS. 7 and 8 will be discussed in detail.

In a first step 1001, a driving radiation beam 902 is provided. The driving radiation beam comprises a plurality of radiation pulses 904.

In a second step 1002, the driving radiation beam 902 is split into first plurality of driving radiation pulses 906a and a second plurality of driving radiation pulses 908a in a manner similar to that described with reference to FIGS. 7 and 8. The driving radiation beam is split by a first beamsplitting element 910. The split ratio of the first beamspliting element may be chosen as described above with reference to FIG. 7.

In a third step 1003, the first controllable characteristic of the first plurality of radiation pulses 906a is controlled so as to control a first portion of an output wavelength spectrum of the illuminating radiation. In the present example, the first plurality of driving radiation pulses is delayed relative to the second plurality of driving radiation pulses 908a. The delay is controlled by a delay control system 912 that comprises an optical delay path with a controllable path length. The first plurality of driving radiation pulses 906a is diverted by a first diverting mirror 920, and then propagates towards one or more delay mirrors 922. The delay mirrors are in the present example mounted on a movable delay element 924, such as a movable stage, that may be moved in at least a first direction (indicated by arrow 926). The first plurality of delayed driving radiation pulses 906b is then reflected by a second diverting mirror 928 and propagates towards an exit beamsplitter 916. As described above, it will be appreciated that the first plurality of driving radiation pulses 906a is modified only by the delay system 912 for exemplary purposes only. The apparatus may optionally comprise one or more additional components 915 that may be used to modify the first plurality of driving radiation pulses in a suitable manner. For example, the additional component may be operable to modify the pulses of the first plurality of driving radiation pulses so as to change the wavelength spectrum generated by the interaction of the first plurality of pulses with the gas in the HHG gas cell. In an example, the additional component may be an optical parametric amplifier. In another example, the additional component may be a pulse control element similar to pulse control element 914 described below. As such, while described in connection with the second controllable characteristic, the pulse control element could, in principle, equally well be used to control the first controllable characteristic. Examples wherein the first plurality of driving radiation pulses are modified by alternative or additional components may easily be envisaged.

In a fourth step 1004, the second controllable characteristic of the second plurality of driving radiation pulses 908a is controlled so as to control a second portion of the output wavelength spectrum of the illuminating radiation. The second controllable characteristic is controlled by a pulse control element 914. The pulse control element comprises an attenuator 930. Subsequently, the second plurality of driving radiation pulses propagate to a pulse control element. In the present example, the pulse control element comprises a Generalized Double Optical Gating (GDOG) element 932. The GDOG element gates out a single cycle of a radiation pulse with linear polarization and causes the remaining cycles of the pulse to be circularly polarized (thereby not generating any harmonic content in the gas in the HHG cell). In the present example, the GDOG effectively gates out each pulse in the second plurality of driving radiation pulses into "single cycle" pulses 908b.

In an optional fifth step 1005, the first plurality of driving radiation pulses and the second plurality of driving radiation pulses are recombined into an output radiation beam 918 by a second beamsplitting element 916. In one example, the second beamsplitting element is a beamsplitter. The second radiation beam may then be used to generate the illuminating radiation.

Figure 11:
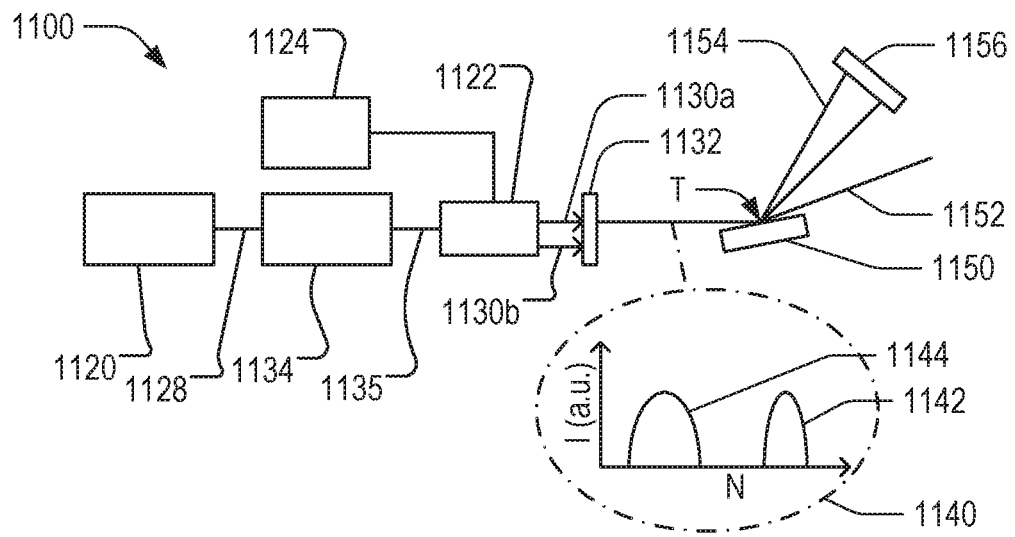
FIG. 11 is a schematic depiction of a metrology apparatus in which the illumination system of FIG. 7 or 9 may be used.
Figure 12:
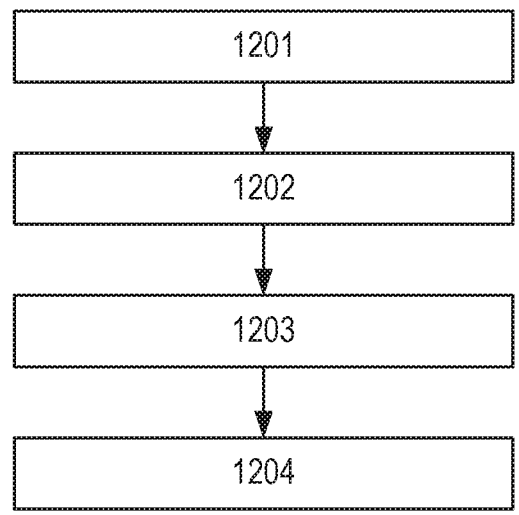
FIG. 12 illustrates a method for using the metrology apparatus of FIG. 11.

FIGS. 11 and 12 show an exemplary metrology apparatus 1100. For ease of comparison with FIG. 4, elements of FIG. 11 similar to corresponding elements of FIG. 4 are labelled with reference signs similar to those used in FIG. 4, but with prefix "11" instead of 4".

The inspection apparatus comprises a pump laser 1120 and an HHG gas cell 1122. A gas supply 1124 supplies suitable gas to the gas cell. The pump laser delivers a first beam of driving radiation beam 1128 to a beam modification element 1134. In an example, the beam modification element is substantially identical to the apparatus described with reference to FIGS. 7 and 8 or FIGS. 9 and 10. Output radiation 1135 from the beam modification element is delivered to the HHG gas cell 1122, where a portion of the output radiation is converted to higher frequencies as described above to create an illuminating radiation beam 1130a, 1130b. In the present example, the output radiation 1135 is substantially identical to the output radiation beam 718 described with reference to FIG. 7 or the output radiation beam 918 described with reference to FIG. 9. The illuminating radiation beam includes both coherent radiation of the desired EUV wavelength or wavelengths (reference 1130a) and driving radiation pulses of the output radiation (reference 1130b). The filtering device 1132 is used to block the driving radiation pulses of the output radiation and transmit only the coherent radiation of the desired EUV wavelength or wavelengths.

After being filtered, the illuminating radiation beam 1130a has an output wavelength spectrum 1140. The output wavelength spectrum comprises a first portion 1142 and a second portion 1144. The first portion is generated by the interaction between the first plurality of radiation pulses and the gas present in the HHG gas cell. In one example, the first portion is substantially identical to the output wavelength spectrum generated by the known source described with reference to FIG. 4. In an example, the first portion comprises radiation with a wavelength of 12-16 nm. In another example, the first portion additionally comprises radiation with a wavelength of 6-11 nm. This may be accomplished in any suitable fashion. In one example, this is accomplished by adding an optical parametric amplifier to the part of the beam modification element 1134 that modifies the first plurality of driving radiation pulses. In yet other examples, the first portion comprises radiation with a wavelength of 10-18 nm, 11-25 nm, 20-28 nm, 20-40 nm or 25-40 nm.

The second portion 1144 of the output wavelength spectrum is generated by the interaction of the second plurality of radiation pulses with the gas of the HHG gas cell. In one example, the second portion of the output wavelength spectrum comprises radiation with a wavelength of 40-50 nm. In another example, the second portion comprises radiation with a wavelength of 45-60 nm. In yet another example, the second portion additionally or alternatively comprises radiation with a wavelength of 20-28 nm, which may, e.g., be accomplished by modifying the split ratio (as described above). In a further example, the second portion may additionally or alternatively comprise radiation with a wavelength of 25-40 nm. This may, e.g., be accomplished by performing post pulse compression and/or gating.

As described above, the first plurality of driving radiation pulses are delayed relative to the second plurality of driving radiation pulses. In some examples, the delay value is chosen such that the pulses of the first plurality do not overlap temporally with the pulses of the second plurality. In other words, in the output radiation 1135 the pulses of the first plurality of driving radiation pulses is temporally interspersed with the pulses of the second plurality of driving radiation pulses. This, in turn, causes the illuminating radiation beam to consists of pulses having a first wavelength within the first portion of the output wavelength spectrum interspersed with pulses having a second wavelength within the second portion of the output wavelength spectrum. In this fashion, the first portion may be temporally be distinguished from the second portion.

The illuminating radiation beam 1130a is then delivered to a substrate 1150 with a target structure T on its surface. The illuminating radiation beam is scattered by the target structure. In the present example, the target structure is a periodic target structure, such as a diffraction grating. In a known fashion, the target structure scatters the incoming radiation into distinct orders of radiation. In the present example, the $0^{th}$ order scattered radiation 1152 is not used. However, it will be realized that the $0^{th}$ order radiation may be used for other purposes. The $1^{st}$ order scattered radiation 1154 is collected by a detector 1156. It should be noted that, while the detector 1156 as shown in FIG. 11 is substantially identical to the first detector 313a shown in FIG. 3, it would equally well be possible to use a detector substantially identical to the second detector 313b of FIG. 3 for performing measurements. In other terms, it would be possible to perform measurements by using the $0^{th}$ order radiation, in a manner similar to that described with reference to FIG. 3.

A method of using the inspection apparatus 1100 will now be described with reference to FIG. 12.

In a first step 1201, a first plurality of driving radiation pulses is provided. The first plurality of driving radiation pulses may be provided in any suitable fashion. In an example, the first plurality is provided as described above with reference to FIGS. 7 and 8 or FIGS. 9 and 10. In an example, the first step further comprises controlling a first controllable characteristic of the first plurality of radiation pulses to control a first portion of an output wavelength spectrum of the illuminating radiation. In one example, the controllable characteristic is a delay of the first plurality of radiation pulses relative to the second plurality of driving radiation pulses. The delay may be set to any suitable value. In some examples, the delay may have a fixed value. In other examples, the delay value may be varied in a suitable fashion. In a specific example, the value of the delay is set so that there is no temporal overlap between the any of the pulses of the first plurality and any of the pulses of the second plurality. In some examples, the delay is between 1 ns and 10 ns. In specific examples, the delay is greater than 3 ns, 4 ns or 5 ns.

In a second step 1202, a second plurality of driving radiation pulses is provided. The second plurality of driving radiation pulses may be provided in any suitable fashion. In an example, the second plurality is provided as described above with reference to FIGS. 7 and 8 or FIGS. 9 and 10. In one example, the second step further comprises controlling a second controllable characteristic of the second plurality of driving radiation pulses is controlled so as to control a second portion of the output wavelength spectrum of the illuminating radiation. In one example, the controllable characteristic is controlled so as to cause the second portion of the output wavelength spectrum to comprise a single wavelength continuum. In some examples, controlling the second controllable characteristic comprises controlling a generation time window for higher harmonic generation of at least one pulse of the second plurality of driving radiation pulses.

In a third step 1203, the first plurality of driving radiation pulses and the second plurality of driving radiation pulses are combined into an illuminating radiation beam. The first and second pluralities of driving radiation pulses may be combined in any suitable manner. In one example, the first and second pluralities are combined by a beamsplitting element, such as a beamsplitter.

In a fourth step 1204, the illuminating radiation beam is used to determine at least one characteristic of a target.

Figure 13:
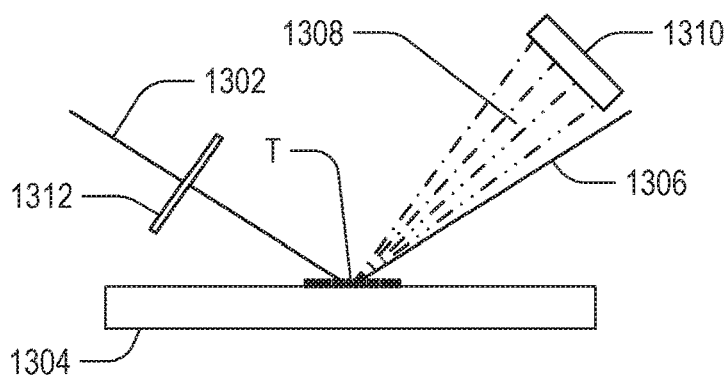
FIG. 13 is a schematic illustration of a first detector setup usable in the metrology apparatus of FIG. 11.

FIG. 13 shows an exemplary detector setup in more detail. An illuminating radiation beam 1302 hits a periodic target structure T on the surface of a substrate 1304, and is scattered in a known fashion. For exemplary purposes $0^{th}$ order scattered radiation 1306 and $1^{st}$ order scattered radiation 1308 is shown in FIG. 13. In the present example, the illuminating radiation beam is substantially identical to the illuminating radiation beam discussed with reference to FIGS. 7 and 8 or FIGS. 9 and 10. It will of course be realized that the periodic target structure is shown for exemplary purposes only, and that a number different of target structures may be envisaged. As described above, the $0^{th}$ order scattered radiation 1306 is not used in the present example. As the illuminating radiation comprises radiation having a wavelength spectrum (as opposed to radiation having a single wavelength), the scattering angle of the $1^{st}$ order scattered radiation is dependent on the wavelength. The detector setup has a detector 1310 that detects the scattered radiation. It should be noted that, while the detector 1156 as shown in FIG. 11 is substantially identical to the first detector 313*a* shown in FIG. 3, it would equally well be possible to use a detector substantially identical to the second detector 313*b* of FIG. 3 for performing measurements. In other terms, it would be possible to perform measurements by using the $0^{th}$ order radiation, in a manner similar to that described with reference to FIG. 3.

In the present example, as described above, the illuminating radiation beam 1302 is comprised of pulses having a first wavelength within the first portion of the output wavelength spectrum interspersed with pulses having a second wavelength within the second portion of the output wavelength spectrum. The target structure T scatters the pulses having the first wavelength at a different angle than the pulses having the second wavelength.

The detector setup further comprises a filter 1312. The filter may be used to modify the output wavelength spectrum of the illuminating radiation beam in a suitable fashion. For example, the filter may be used to block unwanted radiation and to transmit radiation having one or more wavelengths of interest.

An illustrative, and non-limiting, example of the use of a filter in the detector setup will now be discussed. In this example, the illumination radiation beam comprises an output wavelength spectrum having a first portion with a wavelength range of 12-16 nm and a second portion having a wavelength range of 40-50 nm. As is known, the intensity of the output wavelength spectrum varies dependent on the wavelength due to the ionization cross section of the gas in the HHG gas cell. For example, the intensity of the illumination radiation beam may be higher at longer wavelengths than at short wavelengths, which may lead to saturation of the detector at these wavelengths. The filter may comprise one or several filter materials. Each filter material may have specific transmission properties. Filter materials for a particular filter may be chosen dependent on the properties of the illuminating radiation beam and on the properties of the detector.

Figure 14:
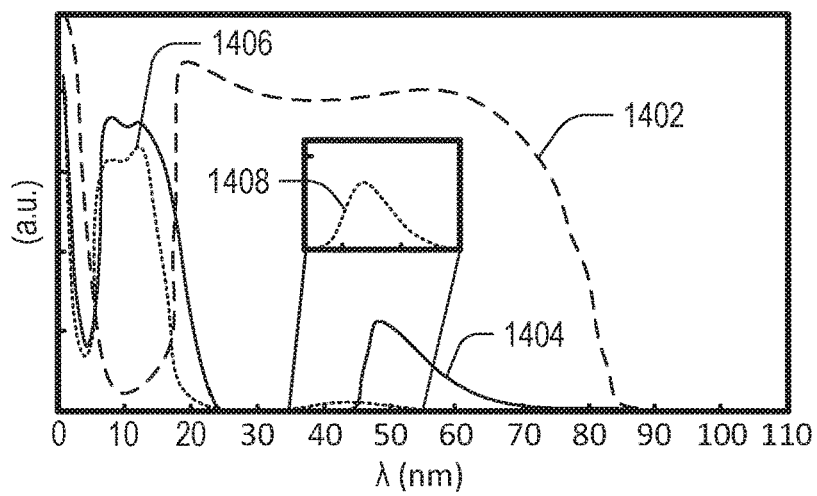
FIG. 14 illustrates schematically a number of exemplary transmission spectra for filter materials usable in the detector setup of FIG. 11.

FIG. 14 shows transmission curves for a number of exemplary filter materials which may be used in the detector setup of FIG. 13. It will be appreciated, of course, that this is for exemplary purposes only and that the materials discussed are not intended to be limiting. A first transmission curve 1402 represents Aluminum (Al). A second transmission curve 1404 represents Zirconium (Zr). A third transmission curve 1406 represents Niobium (Nb).

Figure 15:
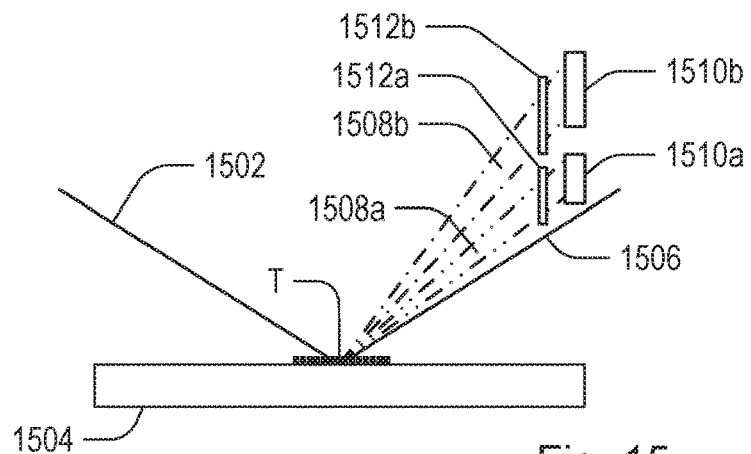
FIG. 15 is a schematic illustration of a second detector setup usable in the metrology apparatus of FIG. 11.

Returning to the example discussed with reference to FIG. 13 above, the detector is saturated at longer wavelengths (e.g. 40-50 nm) but not at shorter wavelengths (e.g. 12-16 nm). In this example, a filter made of Niobium may be used. Niobium, as can be seen in FIG. 14, has transmission "windows" at 5-20 nm and at 35-55 nm (as indicated by reference 1408 in the insert). It will be noted that the transmitted intensity (indicated by the Y-axis) is lower for the window at 35-55 nm. A filter made of Niobium would therefore not substantially impact lower wavelengths, but would at least in part mitigate the above-mentioned detector saturation at the longer wavelengths. FIG. 15 shows a second exemplary detector setup. For ease of comparison with FIG. 13, elements of FIG. 15 similar to corresponding elements of FIG. 13 are labelled with reference signs similar to those used in FIG. 13, but with prefix "15" instead of "13".

In this example, instead of using a single detector (as in FIG. 13), two detectors 1510*a*, 1510*b* are used. The detectors are positioned so as to detect radiation within a specific wavelength spectrum. Given that the diffraction angle of radiation is dependent on the radiation wavelength, the detectors can be positioned so as to only detect certain wavelengths. In this fashion, unwanted radiation wavelengths can be filtered out, thereby reducing the risk of over-saturation of the detectors. In the present example, the first detector 1510*a* is positioned so as to detect scattered radiation 1508*a* having a wavelength falling within the first portion of the output wavelength spectrum. Similarly, the second detector 1510*b* is positioned so as to detect scattered radiation 1508*b* having a wavelength falling within the second portion of the output wavelength spectrum. A first filter 1512*a* and a second filter 1512*b* is positioned in front of the first detector 1510*a* and the second detector 1510*b* respectively. The filter material may be chosen to modify wavelength spectrum of the scattered radiation in any suitable manner. Each of the first filter and the second filter may be made of one or more specific materials, each material having specific transmission properties. Additionally, the first filter may be made of different materials than the second filter. In an example, the filter material for the first filter and/or the second filter is chosen to block radiation above or below a certain wavelength. In another example, the filter material for the first filter and/or the second filter is chosen so as to only transmit radiation in a certain wavelength range. In other examples, one or both of the first filter and the second filter may be omitted altogether.

Additionally or alternatively to the above-described detector setups, examples may be envisaged wherein the detector is operated so as to only detect at specific times. In one example, the detector is be operated so as to only detect radiation within a specific wavelength range during specific periods. In a specific example, the detector is a Micro-Channel Plate (MCP), which is insensitive to infra-red (IR) radiation but has a high detection speed.

It will be appreciated that the above is purely exemplary, and that many other detector types, as well as filter types, may be envisaged. For example, other optical components such as apertures, beam blockers or pinholes may be used as filters in addition to or alternative to the above-described filters. By suitable use of filters, it is possible to further reduce the risk of over-saturation of the detector, as well as to reduce noise in the measurements.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments according to the invention are described in below numbered clauses:

1. A method for generating an illuminating radiation beam in a higher harmonic generation radiation source, comprising:

providing a driving radiation beam, the radiation beam comprising a plurality of radiation pulses, for generating the illuminating radiation beam;

splitting the driving radiation beam into first plurality of driving radiation pulses and a second plurality of driving radiation pulses;

controlling a first controllable characteristic of the first plurality of radiation pulses to control a first portion of an output wavelength spectrum of the illuminating radiation beam; and controlling a second controllable characteristic of the second plurality of radiation pulses to control a second portion of the output wavelength spectrum of the illuminating radiation beam.

2. A method according to clause 1, wherein controlling a first controllable characteristic comprises controlling a delay of the first plurality of radiation pulses relative to the second plurality of radiation pulses by a specific delay value.

3. A method according to clause 1 or clause 2, wherein at least one of the first controllable characteristic or the second controllable characteristic is controlled so as to respectively cause the first portion or the second portion of the output wavelength spectrum to comprise a single wavelength continuum.

4. A method according to any of clauses 1 to 3, wherein at least one of controlling the first controllable characteristic or controlling the second controllable characteristic comprises controlling a generation time window for higher harmonic generation of at least one pulse of the second plurality of driving radiation pulses.

5. A method according to clause 4, wherein at least one of controlling the first controllable characteristic or controlling the second controllable characteristic comprises performing gating on at least one of the first plurality of driving radiation pulses or the second plurality of driving radiation pulses.

6. A method according to clause 4, wherein generalized double optical gating is performed on at least one of the first plurality of driving radiation pulses or the second plurality of driving radiation pulses.

7. A method according to clause 4, wherein at least one of controlling the first controllable characteristic or controlling the second controllable characteristic comprises performing pulse compression on at least one of the first plurality of driving radiation pulses or the second plurality of driving radiation pulses.

8. A method according to any preceding clause, wherein at least one of the first controllable characteristic or the second controllable characteristic is controlled such that the second portion of the output wavelength spectrum is different from the first portion of the output wavelength spectrum.

9. A method for an inspection apparatus, comprising:

providing a first plurality of driving radiation pulses;

providing a second plurality of driving radiation pulses;

combining the first plurality of output pulses and the second plurality of output pulses into an illuminating radiation beam; and using the illuminating radiation beam to determine at least one characteristic of a target, wherein:

the step of providing a first plurality of radiation pulses comprises controlling a first controllable characteristic of the first plurality of radiation pulses to control a first portion of an output wavelength spectrum of the illuminating radiation; and the step of providing a second plurality of radiation pulses comprises controlling a second controllable characteristic of the second plurality of radiation pulses to control a second portion of the output wavelength spectrum of the illuminating radiation.

10. A method according to clause 9, wherein controlling a first controllable characteristic comprises controlling a delay of the first plurality of radiation pulses relative to the second plurality of radiation pulses by a specific delay value.

11. A method according to clause 9 or clause 10, wherein at least one of the first controllable characteristic or the second controllable characteristic is controlled so as to respectively cause the first portion or the second portion of the output wavelength spectrum to comprise a single wavelength continuum.

12. A method according to any of clauses 9 to 11, wherein at least one of controlling the first controllable characteristic or controlling the second controllable characteristic comprises controlling a generation time window for higher harmonic generation of at least one pulse of the second plurality of driving radiation pulses.

13. A method according to clause 12, wherein at least one of controlling the first controllable characteristic or controlling the second controllable characteristic comprises performing gating on the second plurality of driving radiation pulses.

14. A method according to clause 12, wherein generalized double optical gating is performed on at least one of the first plurality of driving radiation pulses or the second plurality of driving radiation pulses.

15. A method according to clause 12, wherein at least one of controlling the first controllable characteristic or controlling the second controllable characteristic comprises performing pulse compression on the second plurality of driving radiation pulses.

16. A method according to any of clauses 9 to 15, wherein at least one of the first controllable characteristic or the second controllable characteristic is controlled such that the second portion of the output wavelength spectrum is different from the first portion of the output wavelength spectrum.

17. An illumination apparatus comprising means for carrying out the method of any of clauses 1 to 8.

18. An inspection apparatus comprising means for carrying out the method of any of clauses 9 to 16.

19. An inspection apparatus according to clause 18, comprising an illumination apparatus according to clause 17.

20. A method of manufacturing devices wherein device features and metrology targets are formed on a series of substrates by a lithographic process, wherein properties of the metrology targets on one or more processed substrates are measured by a method according to any of clauses 9 to 16, and wherein the measured properties are used to adjust parameters of the lithographic process for the processing of further substrates.

21. A computer program product comprising machine-readable instructions for causing a processor to perform the controlling steps of any of clauses 1 to 8 or the controlling steps of any of clauses 9 to 16.

22. A lithographic system comprising:
a lithographic apparatus comprising:
an illumination optical system arranged to illuminate a pattern,
a projection optical system arranged to project an image of the pattern onto a substrate; and
an inspection apparatus according to clause 18 or 19,
wherein the lithographic apparatus is arranged to use one or more parameters calculated by the inspection apparatus in applying the pattern to further substrates.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for generating an illuminating radiation beam in a higher harmonic generation radiation source, comprising:
splitting a radiation beam into first and second plurality of radiation pulses;
controlling a first controllable characteristic of the first plurality of radiation pulses to produce a first portion of an output beam that is utilized to control a first portion of an output wavelength spectrum of the illuminating radiation beam;
controlling a second controllable characteristic of the second plurality of radiation pulses to produce a second portion of an output beam that is utilized to control a second portion of the output wavelength spectrum of the illuminating radiation beam; and
combining the first and second portions of the output beam at a beam splitter.

2. The method of claim 1, wherein controlling a first controllable characteristic comprises controlling a delay of the first plurality of radiation pulses relative to the second plurality of radiation pulses by a specific delay value.

3. The method of claim 1, wherein at least one of the first controllable characteristic or the second controllable characteristic is controlled so as to respectively cause the first portion or the second portion of the output wavelength spectrum to comprise a single wavelength continuum.

4. The method of claim 1, wherein at least one of the controlling the first controllable characteristic or the controlling the second controllable characteristic comprises controlling a generation time window for higher harmonic generation of at least one pulse of the second plurality of radiation pulses.

5. The method of claim 4, wherein at least one of the controlling the first controllable characteristic or the controlling the second controllable characteristic comprises performing gating on at least one of the first plurality of radiation pulses or the second plurality of radiation pulses.

6. The method of claim 4, further comprising performing generalized double optical gating on at least one of the first plurality of radiation pulses or the second plurality of radiation pulses.

7. The method of claim 4, wherein at least one of the controlling the first controllable characteristic or the controlling the second controllable characteristic comprises performing pulse compression on at least one of the first plurality of driving radiation pulses or the second plurality of driving radiation pulses.

8. The method claim 1, wherein at least one of the first controllable characteristic or the second controllable characteristic is controlled such that the second portion of the output wavelength spectrum is different from the first portion of the output wavelength spectrum.

9. A method for an inspection apparatus, comprising:
controlling a first controllable characteristic of a first plurality of radiation pulses to produce a first portion of an output beam that is utilized to control a first portion of an output wavelength spectrum of an illuminating radiation beam;
controlling a second controllable characteristic of a second plurality of radiation pulses to produce a second portion of the output beam that is utilized to control a second portion of the output wavelength spectrum of the illuminating radiation beam;
combining the first and second portions of the output beam, wherein the first and second portions are non-counterpropagating before the combining; and
using the illuminating radiation beam to determine at least one characteristic of a target.

10. The method of claim 9, wherein the controlling the first controllable characteristic comprises controlling a delay of the first plurality of radiation pulses relative to the second plurality of radiation pulses by a specific delay value.

11. The method of claim 9, wherein at least one of the first controllable characteristic or the second controllable characteristic is controlled so as to respectively cause the first portion or the second portion of the output wavelength spectrum to comprise a single wavelength continuum.

12. The method of claim 9, wherein at least one of the controlling the first controllable characteristic or the controlling the second controllable characteristic comprises controlling a generation time window for higher harmonic generation of at least one pulse of the second plurality of radiation pulses.

13. The method of claim 12, wherein at least one of the controlling the first controllable characteristic or the controlling the second controllable characteristic comprises performing gating on the second plurality of radiation pulses.

14. The method of claim 12, further comprising performing generalized double optical gating on at least one of the first or second plurality of radiation pulses.

15. A method of manufacturing devices, comprising:
forming device features and metrology targets on a series of substrates by a lithographic process;
measuring properties of the metrology targets on one or more processed substrates by a method comprising:
  controlling a first controllable characteristic of a first plurality of radiation pulses to produce a first portion of an output beam that is utilized to control a first portion of an output wavelength spectrum of an illuminating radiation beam;
  controlling a second controllable characteristic of a second plurality of radiation pulses to produce a second portion of the output beam that is utilized to control a second portion of the output wavelength spectrum of the illuminating radiation beam;
  combining, using a combiner, the first and second portions of the output beam wherein the first and second portions are non-counterpropagating upon entering the combiner and before the combining; and
using the illuminating radiation beam to determine at least one characteristic of the metrology targets,
wherein the measured properties are used to adjust parameters of the lithographic process for processing of further substrates.

16. A method comprising:
splitting a radiation beam into first and second plurality of radiation pulses;
using a non-transitory computer program product comprising machine-readable instructions to cause a processor to perform
  controlling a first controllable characteristic of the first plurality of radiation pulses to produce a first portion of an output beam that is utilized to control a first portion of an output wavelength spectrum of the illuminating radiation beam;
  controlling a second controllable characteristic of the second plurality of radiation pulses to produce a second portion of the output beam that is utilized to control a second portion of the output wavelength spectrum of the illuminating radiation beam; and
  combining the first and second portions of the output beam at a beam splitter.

17. A non-transitory computer program product comprising machine-readable instructions for causing a processor to perform operations comprising:
controlling a first controllable characteristic of a first plurality of output pulses to produce a first portion of an output beam that is utilized to control a first portion of an output wavelength spectrum of an illuminating radiation beam;
controlling a second controllable characteristic of a second plurality of output pulses to produce a second portion of the output beam that is utilized to control a second portion of the output wavelength spectrum of the illuminating radiation beam;
combining, using a beam splitter, the first and second portions of the output beam; and
determining, using the illuminating radiation beam, at least one characteristic of a target.

18. A lithographic system comprising:
an illumination optical system arranged to illuminate a pattern;
a projection optical system arranged to project an image of the pattern onto a substrate; and
an inspection apparatus comprising:
  a source of radiation configured to provide a radiation beam, the radiation beam comprising a plurality of radiation pulses;
  a first beam splitter configured to split the driving radiation beam into first plurality of radiation pulses and a second plurality of radiation pulses;
  a first controlling device configured to control a first controllable characteristic of the first plurality of radiation pulses to produce a first portion of an output beam that is utilized to control a first portion of an output wavelength spectrum of an illuminating radiation; and
  a second controlling device configured to control a second controllable characteristic of the second plurality of radiation pulses to produce a second portion of the output beam that is utilized to control a second portion of the output wavelength spectrum of the illuminating radiation beam; and
  a second beam splitter configured to combine the first and second portions of the output beam,
  wherein the inspection apparatus is configured to use the illuminating radiation beam to calculate one or more parameters of the pattern;
wherein the lithographic system is arranged to use one or more parameters calculated by the inspection apparatus in applying the pattern to further substrates.

19. The lithographic system of claim 18, wherein neither of the first or second portions of the output beam enter the second beam splitter from a same surface the output beam exits the beam splitter.

20. The lithographic system of claim 18, wherein the first and second portions of the output beam are received at one or more respective surfaces of the second beam splitter that are different than a surface of the beam splitter through which the combined the first and second portions are output as the output beam.

21. The lithographic system of claim 18, wherein the first and second portions of the output beam are non-counterpropagating as they enter the beam splitter.

22. A lithographic system comprising:
an illumination optical system arranged to illuminate a pattern;
a projection optical system arranged to project an image of the pattern onto a substrate; and
an inspection apparatus comprising:
  a radiation source configured to provide a first and second plurality of radiation pulses, to control a first controllable characteristic of the first plurality of radiation pulses to produce a first portion of an output beam that is used to control a first portion of an output wavelength spectrum of an illuminating radiation beam, and to control a second controllable characteristic of the second plurality of radiation pulses to produce a second portion of the output beam used to control a second portion of the output wavelength spectrum of the illuminating radiation beam;

a beam splitter configured to combine the first and second portions of the output beam; and wherein the inspection device is configured to use the illuminating radiation beam to determine at least one characteristic of a target.

\* \* \* \* \*

UNITED STATES PATENT AND TRADEMARK OFFICE
CERTIFICATE OF CORRECTION

PATENT NO.           : 10,048,596 B2
APPLICATION NO.      : 15/585072
DATED                : August 14, 2018
INVENTOR(S)          : Lin et al.

Page 1 of 1

It is certified that error appears in the above-identified patent and that said Letters Patent is hereby corrected as shown below:

On the Title Page

In item (57) Abstract, please replace "An method for generating" with --A method for generating--.

In the Claims

In Column 24, Lines 36-37, please replace "driving radiation pulses or the second plurality of driving radiation pulses" with --radiation pulses or the second plurality of radiation pulses--.

In Column 24, Line 38, please replace "The method claim 1" with --The method of claim 1--.

In Column 25, Line 31, please replace "output beam wherein the first" with --output beam, wherein the first--.

In Column 25, Line 44, please replace "perform" with --perform:--.

In Column 26, Line 17, please replace "into first plurality" with --into a first plurality--.

In Column 26, Line 48, please replace "the combined the first" with --the combined first--.

Signed and Sealed this
First Day of January, 2019

Andrei Iancu
*Director of the United States Patent and Trademark Office*